United States Patent
Shen et al.

(10) Patent No.: US 10,833,171 B1
(45) Date of Patent: Nov. 10, 2020

(54) SPACER STRUCTURES ON TRANSISTOR DEVICES

(71) Applicant: GLOBALFOUNDRIES Inc., Grand Cayman (KY)

(72) Inventors: Yanping Shen, Saratoga Springs, NY (US); Jiehui Shu, Clifton Park, NY (US); Hui Zang, Guilderland, NY (US)

(*) Notice: Subject to any disclaimer, the term of this patent is extended or adjusted under 35 U.S.C. 154(b) by 0 days.

(21) Appl. No.: 16/385,436

(22) Filed: Apr. 16, 2019

(51) Int. Cl.
*H01L 29/76* (2006.01)
*H01L 31/062* (2012.01)
*H01L 31/113* (2006.01)
*H01L 29/66* (2006.01)
*H01L 27/108* (2006.01)
*H01L 27/088* (2006.01)
*H01L 21/8234* (2006.01)

(52) U.S. Cl.
CPC .. *H01L 29/6656* (2013.01); *H01L 21/823431* (2013.01); *H01L 27/0886* (2013.01); *H01L 27/10879* (2013.01); *H01L 29/66795* (2013.01)

(58) Field of Classification Search
CPC ............. H01L 29/785; H01L 29/66795; H01L 29/7831; H01L 21/823431; H01L 27/0886; H01L 27/1211; H01L 29/7848; H01L 29/665

USPC ......................................................... 257/365
See application file for complete search history.

(56) References Cited

U.S. PATENT DOCUMENTS

| | | | |
|---|---|---|---|
| 9,419,101 B1 | 8/2016 | Peng et al. | |
| 2009/0315116 A1* | 12/2009 | Sakuma | H01L 29/165 257/368 |
| 2013/0175545 A1* | 7/2013 | Flachowsky | H01L 29/7848 257/77 |
| 2015/0214113 A1 | 7/2015 | Bouche et al. | |
| 2016/0365424 A1 | 12/2016 | Basker et al. | |

* cited by examiner

*Primary Examiner* — Theresa T Doan
(74) *Attorney, Agent, or Firm* — Hoffman Warnick LLC

(57) ABSTRACT

Disclosed is a transistor that includes a sidewall spacer positioned adjacent a sidewall of a gate structure, wherein the sidewall spacer comprises a notch proximate the lower end and wherein the notch is defined by a substantially vertically oriented side surface and a substantially horizontally oriented upper surface. An epi cavity in the substrate includes a substantially vertically oriented cavity sidewall that is substantially vertically aligned with the substantially vertically oriented side surface of the notch and an epi semiconductor material positioned in the epi cavity and in the notch, wherein the epi semiconductor material contacts and engages the substantially vertically oriented side surface of the notch and the substantially horizontally oriented upper surface of the notch.

8 Claims, 14 Drawing Sheets

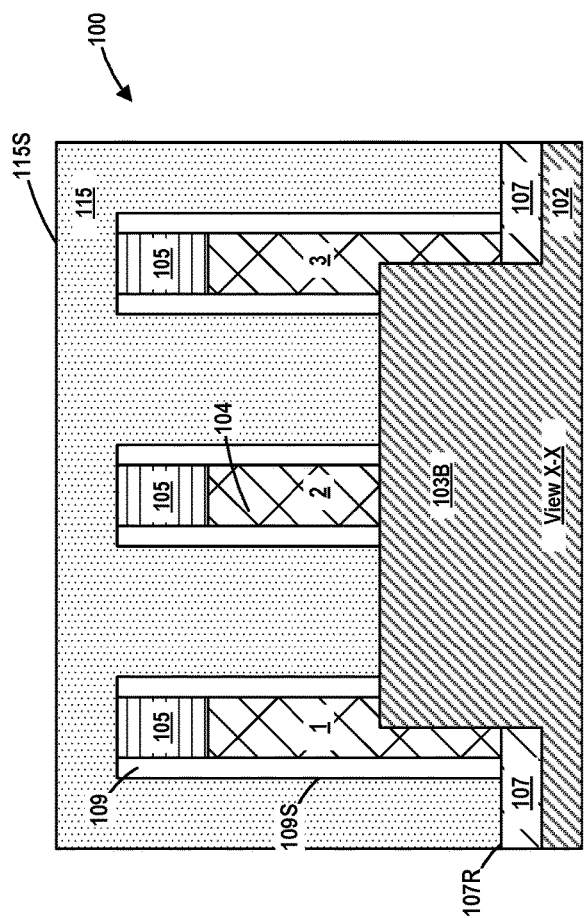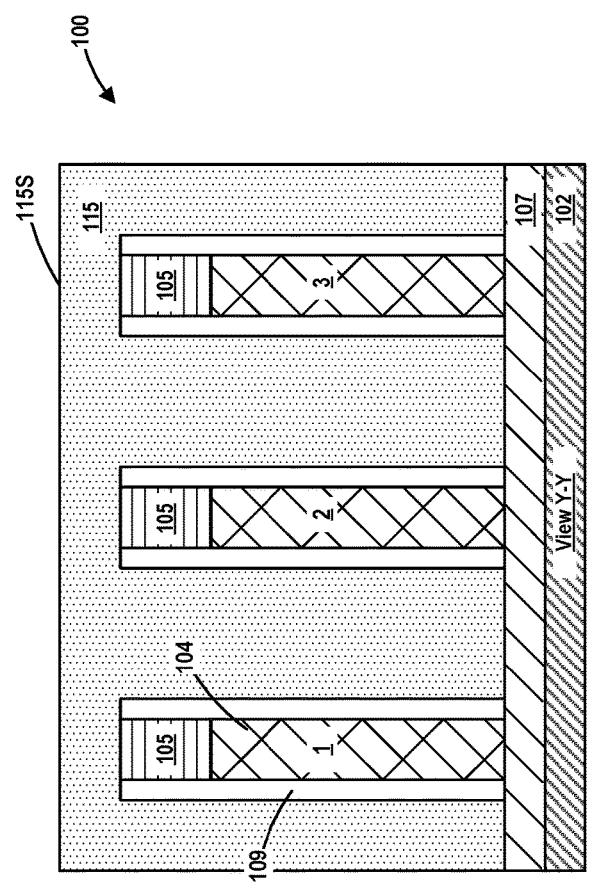

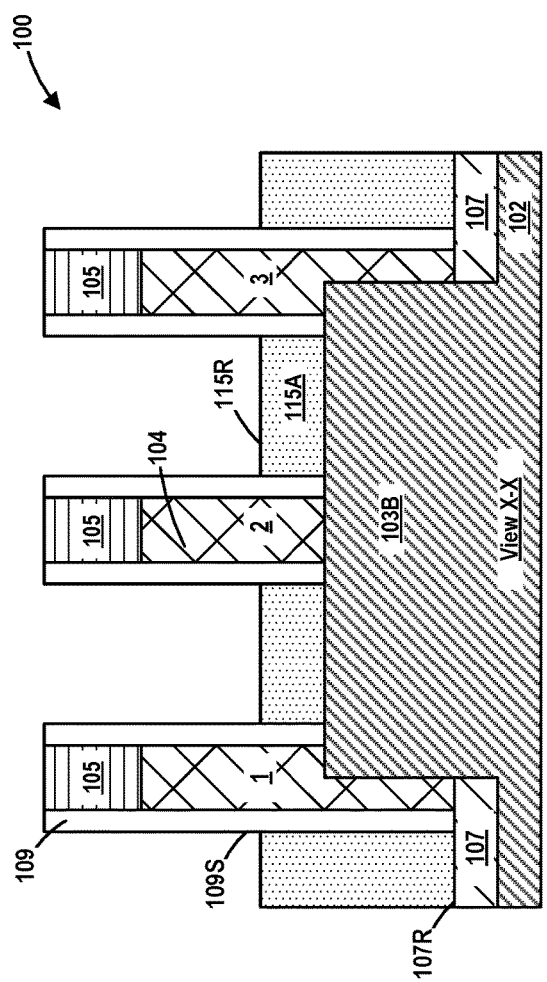
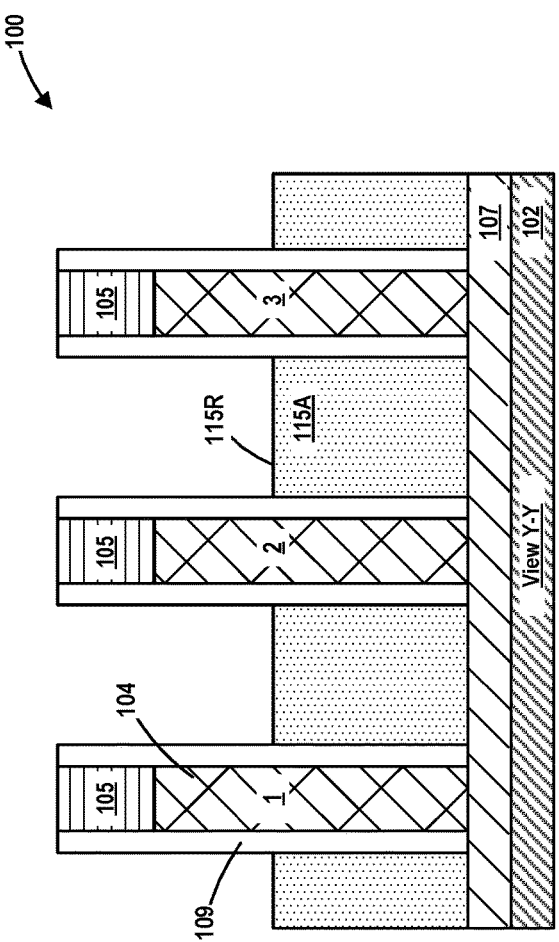

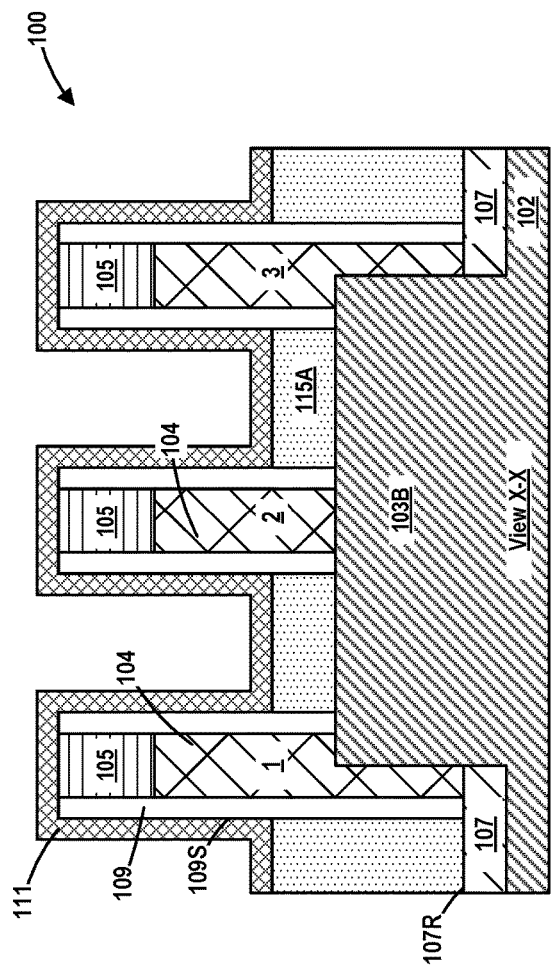
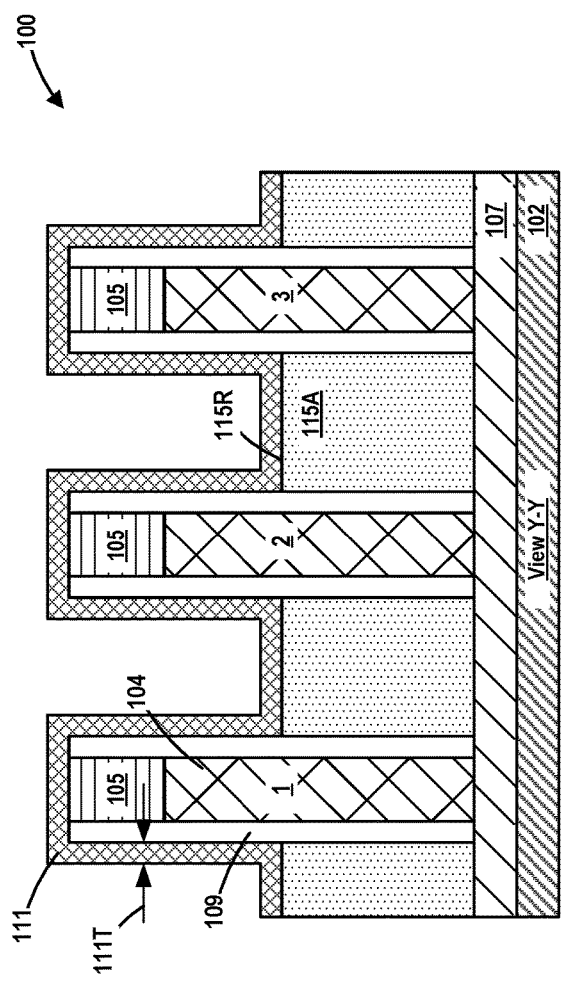

SPACER STRUCTURES ON TRANSISTOR DEVICES

BACKGROUND

Field of the Disclosure

The present disclosure generally relates to the fabrication of semiconductor devices, and, more particularly, to various novel methods of forming spacers on a transistor device and to the formation of spacers having a novel configuration.

Description of the Related Art

In modern integrated circuit products, such as microprocessors, storage devices, ASICs and the like, a very large number of circuit elements, especially transistors, are provided on a restricted chip area. The transistors come in a variety of shapes and forms, e.g., planar transistors, FinFET transistors, nanowire devices, fully-depleted devices (FD-SOI), etc. The transistors are typically either NFET or PFET type devices wherein the "N" and "P" designation is based upon the type of dopants used to create the source/drain regions of the devices. A transistor typically includes a conductive gate structure, a source region and a drain region.

Device designers are under constant pressure to increase the operating speed and electrical performance of transistors and integrated circuit products that employ such transistors. Given that the gate length (the distance between the source and drain regions) on modern transistor devices may be approximately 20-50 nm, and that further scaling is anticipated in the future, device designers have employed a variety of techniques in an effort to improve device performance, e.g., the use of high-k dielectrics, the use of channel stress engineering techniques on transistors (create a tensile stress in the channel region for NFET transistors and create a compressive stress in the channel region for PFET transistors), etc.

In many modern transistor devices, it is very common to form epitaxial (epi) semiconductor material in the source/drain regions of the transistor devices, i.e., to form raised source/drain regions. The formation of such epi semiconductor material can have several beneficial effects on the performance characteristics of the transistor devices, e.g., it can reduce the resistance of the source/drain regions and it may be useful in imparting a desired stress condition, e.g., compressive or tensile, on the channel region of the transistor. Unfortunately, as device dimensions continue to shrink, e.g., as the gate pitch continues to decrease, the size or volume of the epi semiconductor material in the source/drain regions also tends to decrease. Such reduction in the volume of epi semiconductor material in the source/drain regions may lead to undesirable increases in the resistance of the source/drain regions and/or limit the effectiveness of the epi semiconductor material as it relates to imparting desired stress conditions on the channel region of the transistor device.

The present disclosure is directed to various novel methods of forming spacers on a transistor device and to the formation of spacers having a novel configuration that may avoid, or at least reduce, the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming spacers on a transistor device and to the formation of spacers having a novel configuration. One illustrative method disclosed herein includes forming a sidewall spacer adjacent a gate structure, the sidewall spacer having a first end and a second end, the first end being positioned adjacent the semiconductor substrate, forming a notch in the sidewall spacer proximate the first end, after forming the notch, forming an epi cavity in the semiconductor substrate, and forming an epi semiconductor material in the epi cavity and in the notch in the sidewall spacer.

One illustrative transistor device disclosed herein includes a gate structure positioned above a semiconductor substrate, a sidewall spacer positioned adjacent a sidewall of the gate structure, the sidewall spacer having a first end and a second end, the first end being positioned adjacent the semiconductor substrate, a notch in the sidewall spacer proximate the first end, an epi cavity in the semiconductor substrate, and an epi semiconductor material positioned in the epi cavity and in the notch in the sidewall spacer.

BRIEF DESCRIPTION OF THE DRAWINGS

The disclosure may be understood by reference to the following description taken in conjunction with the accompanying drawings, in which like reference numerals identify like elements, and in which:

FIGS. 1-25 are drawings that depict various novel methods of forming spacers on a transistor device and to the formation of spacers having a novel configuration.

Figure 1:
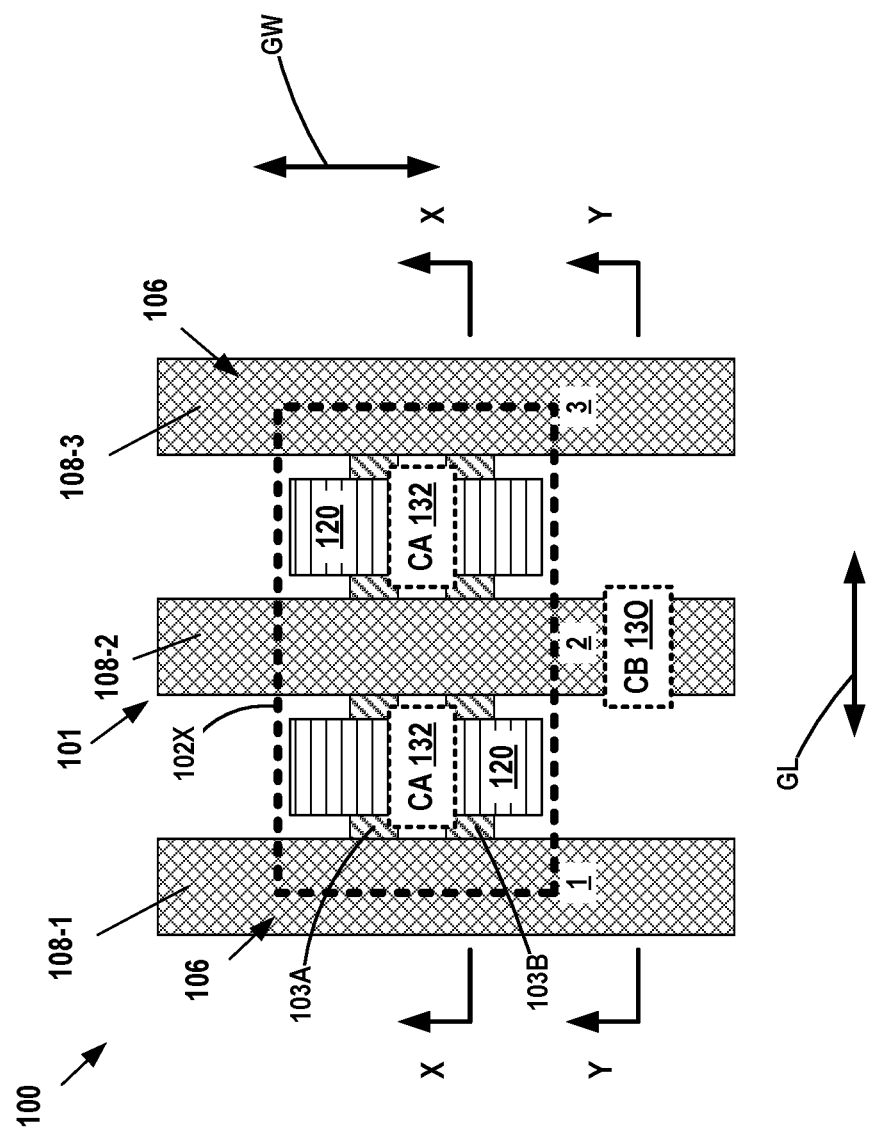

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various novel methods of forming spacers on a transistor device 101, various methods of forming spacers having a novel configuration and corresponding integrated circuit products. The methods and devices disclosed herein may be employed in manufacturing IC products using a variety of technologies, e.g., NMOS, PMOS, CMOS, etc., and they may be employed in manufacturing a variety of different products, e.g., memory products, logic products, ASICs, fully depleted devices (FDSOI), etc. As will be appreciated by those skilled in the art after a complete reading of the present application, the methods and devices disclosed herein may be employed in forming integrated circuit products using transistor devices in a variety of different configurations, e.g., planar devices, FinFET devices, etc. The gate structures of the transistor devices may be formed using either "gate first" or "replacement gate" manufacturing techniques. Thus, the presently disclosed subject matter should not be considered to be limited to any particular form of transistors or the manner in which the gate structures of the transistor devices are formed. In the examples depicted in the drawings, the transistor devices 101 will be planar transistor devices wherein the gate structure 104 of the devices 101 was formed using known replacement gate manufacturing techniques. Of course, the inventions disclosed herein should not be considered to be limited to the illustrative examples depicted and described herein. With reference to the attached figures, various illustrative embodiments of the methods and devices disclosed herein will now be described in more detail.

FIGS. 1-25 are drawings that depict various novel methods of forming spacers on a transistor device and corresponding integrated circuit products 100 having a novel structural configuration. Various cross-sectional views of the product 100 (views "X-X" and "Y-Y") that are depicted in the attached drawings are taken where indicated in FIG. 1. The cross-sectional views in the attached drawings are taken in the gate length direction ("GL") of the transistor devices 101. The gate width direction ("GW") of the transistor devices 101 is also depicted in FIG. 1. It should be noted that the drawings depicted herein are not to scale.

Figure 2:
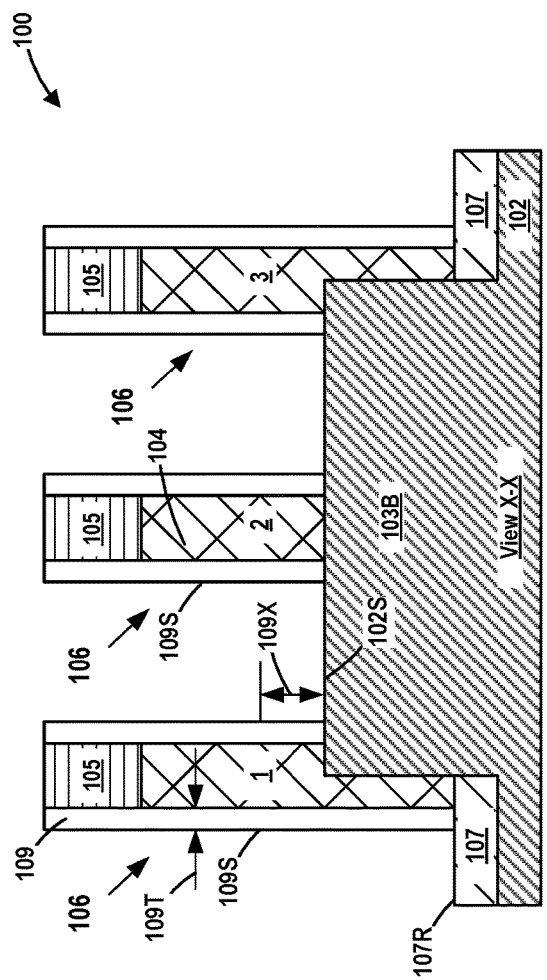
Figure 3:
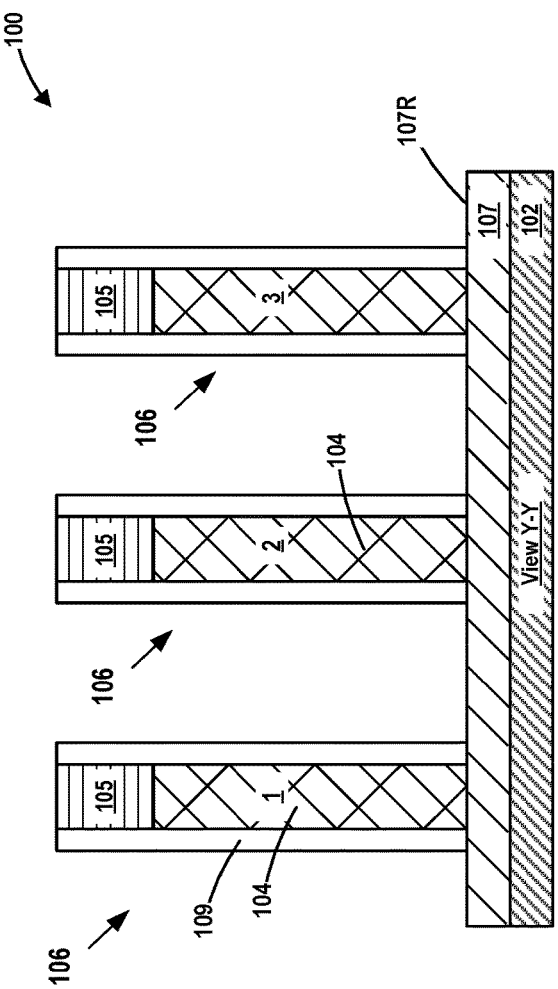

With reference to FIGS. 1-3, the product 100 generally comprises a plurality of gates 106 (numbered 1-3 for ease of reference) that are formed in and above an illustrative bulk semiconductor substrate 102. In the illustrative example depicted herein, the product 100 comprises one active transistor 101 (with gate 2) formed above an active region 102X. Those skilled in the art will appreciate the two outermost gates (gates 1 and 3) are sometimes referred to as "tucked" gate structures. The tucked gates 1 and 3 are "dummy gates" as it relates to the operation of the single active transistor 101 (gate 2). Each of the gates 106 includes a schematically depicted final gate structure 108 (numbered 108-1 to 108-3) for reference purposes). The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

In the illustrative example depicted herein, the transistor devices 101 are FinFET devices. However, after a complete reading of the present application, those skilled in the art will recognize and appreciate that the inventions disclosed herein should not be considered to be limited to only IC products that include FinFET transistor devices, as the methods and structures disclosed herein may be used to form a variety of different types or forms of transistor devices, e.g., planar devices, FDSOI devices, etc. At the point of processing shown in FIGS. 1-3, a plurality of fins 103A-B (collectively referenced using the numeral 103) have been formed in the substrate 102 using traditional manufacturing techniques. Also depicted are illustrative conductive source/drain structures 120 (e.g., trench silicide structures) that will be formed on the product 100 so as to permit the source/drain regions of the transistor devices 101 to be conductively contacted.

FIG. 1 also depicts the illustrative active region (dashed line region 102X) for the transistor device 101. Also depicted in FIG. 1 is the location where an illustrative CB gate contact structure 130 will be formed to contact the schematically depicted final gate structure 108-2 of the active transistor 101. In this particular example, the CB gate contact structure 130 may be formed entirely above isolation material that surrounds the active region 102X. In other applications (not shown), the CB gate contact structure 130 may be formed partially or entirely above the active region 102X. Lastly, FIG. 1 also depicts the location where a plurality of illustrative CA contact structures 132 will be formed to contact the conductive source/drain structures 120 of the various transistor devices 101.

In this particular example, the schematically depicted final gate structure 108 will be formed by performing known replacement gate manufacturing techniques. However, after a complete reading of the present application, those skilled in the art will recognize and appreciate that the final gate structures 108 could also be formed using known gate-first manufacturing techniques.

In view of the foregoing, FIGS. 2 and 3 depict the product 100 after several process operations were performed. First, the above-mentioned fins 103 were formed by performing one or more etching processes, e.g., anisotropic etching processes, through a patterned fin-formation etch mask (not shown) to form a plurality of fin-formation trenches in the substrate 102 and thereby define the plurality of fins 103. The width and height of the fins 103 may vary depending upon the particular application. Additionally, the overall size, shape and configuration of the fin-formation trenches and fins 103 may vary depending on the particular application. Next, a recessed layer of insulating material 107 (e.g., silicon dioxide), with a recessed upper surface 107R, was formed between the fins 103 by performing traditional manufacturing techniques.

Still referencing FIGS. 2 and 3, after the layer of insulating material 107 was recessed, the gates 106 were formed above the fins 103. Each of the gates 106 includes a schematically depicted sacrificial gate structure 104, a gate cap 105 and a simplistically-depicted sidewall spacer 109. The sacrificial gate structures 104 may include a sacrificial gate insulation layer (not separately shown) comprised of silicon dioxide and a sacrificial gate electrode structure (not separately shown) comprised of amorphous silicon or polysilicon. A gate cap 105 (e.g., silicon nitride) is positioned above each of the sacrificial gate structures 104. In one illustrative process flow, the sacrificial gate structures 104 (with the gate cap 105 thereabove) are initially formed as continuous line-type structures that extend across substantially the entire substrate 102. The long continuous line-type sacrificial gate structure 104/gate cap 105 structures may be formed by depositing the materials for the sacrificial gate structures 104 as well as a layer of material for the gate caps 105 across the entire substrate 102, forming a patterned gate etch mask (not shown) above the deposited layer of the material for the gate caps 105, and performing one or more etching processes through the patterned gate etch mask to remove the exposed portions of gate cap material and, thereafter, the exposed portions of the materials of the gate structure.

Also depicted in FIGS. 2 and 3 is the above-mentioned sidewall spacer 109 that was formed adjacent the sidewalls of the sacrificial gate structures 104 and the gate caps 105. In one illustrative example, the sidewall spacer 109 may be formed by depositing a conformal layer of first spacer material across the substrate 102 and on the sidewall of the sacrificial gate structures 104 and thereafter performing an anisotropic etching process on the layer of first spacer material to remove substantially all of the horizontally-oriented portions of the layer of first spacer material. In one particular example, the sidewall spacer 109 may be formed on and in contact with the sidewalls of the sacrificial gate structure 104 (or the final gate structure in the case of a gate-first manufacturing process). Additionally, in one illustrative embodiment, a bottom surface of the sidewall spacer 109 may be formed positioned on and in contact with the upper surface 102S of the semiconductor substrate 102. In other embodiments, there may be another material(s) positioned between the bottom surface of the sidewall spacer 109 and the upper surface 102S.

The sidewall spacer 109 may be comprised of a variety of different materials, e.g., a low-k material (k value of about 5.5 or less), SiOCN, SiBCN, etc., and it may be formed to any desired thickness 109T, e.g., 5-10 nm based upon current-day technology. It should be noted that the thickness 109T of the sidewall spacer 109 may be substantially uniform for at least a distance 109X (e.g., 5-10 nm) above an upper surface 102S of the substrate 102 (above the upper surface of the fin in the case where the transistor device 101 is a FinFET device). Also note that the sidewall spacer 109 has a substantially vertically oriented outer surface 109S for at least the distance 109X above the upper surface 102S of the substrate (or fin 103 in the case of a FinFET device). In the examples depicted herein, the simplistically depicted sidewall spacer 109 has a substantially rectangular shaped cross-sectional configuration when viewed in a cross-section taken through the sidewall spacer 109 in the gate length direction of the transistor devices 101. However, in a real-world IC product 100, the thickness 109T of the sidewall spacer 109 may not be uniform throughout its entire vertical height, e.g., the thickness of the sidewall spacer 109 may decrease (to at least some degree) at locations proximate the upper portion of the sacrificial gate structure 104 and/or the gate cap 105 relative to its thickness closer to the upper surface 102S.

FIGS. 4 and 5 depict the IC product 100 after an initial sacrificial layer of material 115, e.g., OPL, SOH, etc., with an initial thickness was formed across the substrate 102. As depicted, an as-formed upper surface 115S of the initial layer of sacrificial material 115 is positioned at a level that is above a level of an upper surface of the gate caps 105. The as-formed upper surface 115S may or may not be substantially planar as depicted in the drawings. If desired, a planarization process (e.g., a chemical mechanical planarization (CMP) process) may be performed on the sacrificial layer of material 115 after it is initially formed.

FIGS. 6 and 7 depict the IC product 100 after a recess etching process was performed to reduce the initial thickness of the initial sacrificial layer of material 115 to a desired final thickness. This process operation results in the formation of a recessed sacrificial layer of material 115A that has a recessed upper surface 115R. The amount of recessing of the initial sacrificial layer of material 115 may vary depending upon the particular application. In one illustrative example, the recessed sacrificial layer of material 115A may have a thickness of about 20-50 nm.

FIGS. 8 and 9 depict the product 100 after a conformal deposition process was performed to form a conformal layer of sacrificial spacer material 111 across the substrate 102, on the sidewall spacers 109 and above the recessed sacrificial layer of material 115A. The conformal layer of sacrificial spacer material 111 may be comprised of a variety of different materials, e.g., silicon dioxide, etc., and it may be formed to any desired thickness 111T, e.g., 2-3 nm based upon current-day technology.

Figure 10:
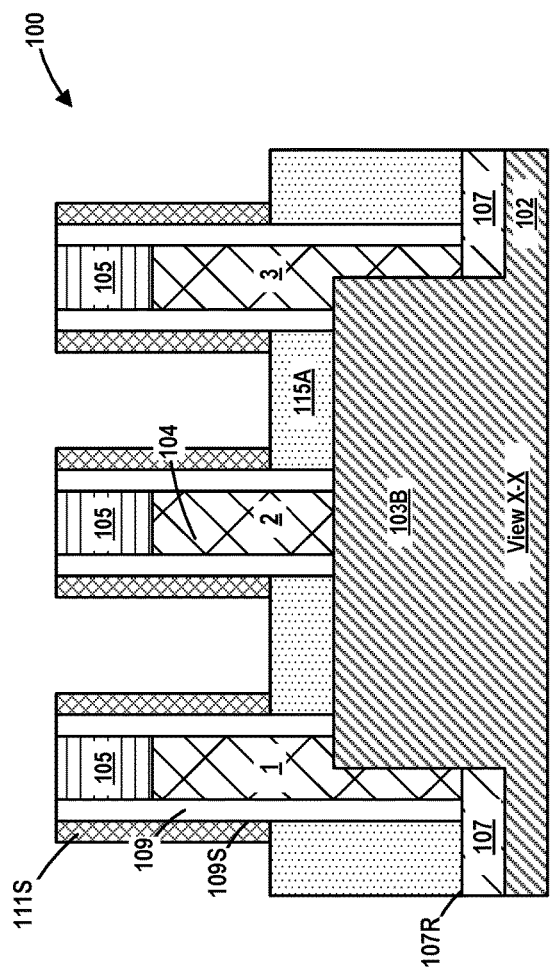
Figure 11:
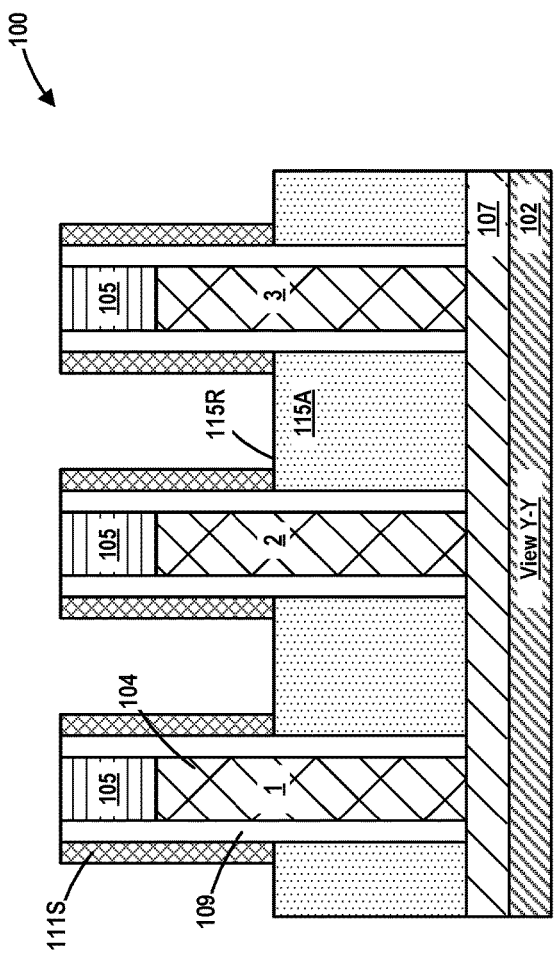

FIGS. 10 and 11 depict the IC product 100 after an anisotropic etching process was performed to remove horizontally oriented portions of the conformal layer of sacrificial spacer material 111. This process operation results in the formation of a sacrificial sidewall spacer 111S that is positioned proximate the sidewall spacer 109. In one illustrative embodiment, the sacrificial sidewall spacer 111S may be formed on and in contact with the outer surface 109S of the sidewall spacer 109.

Figure 12:
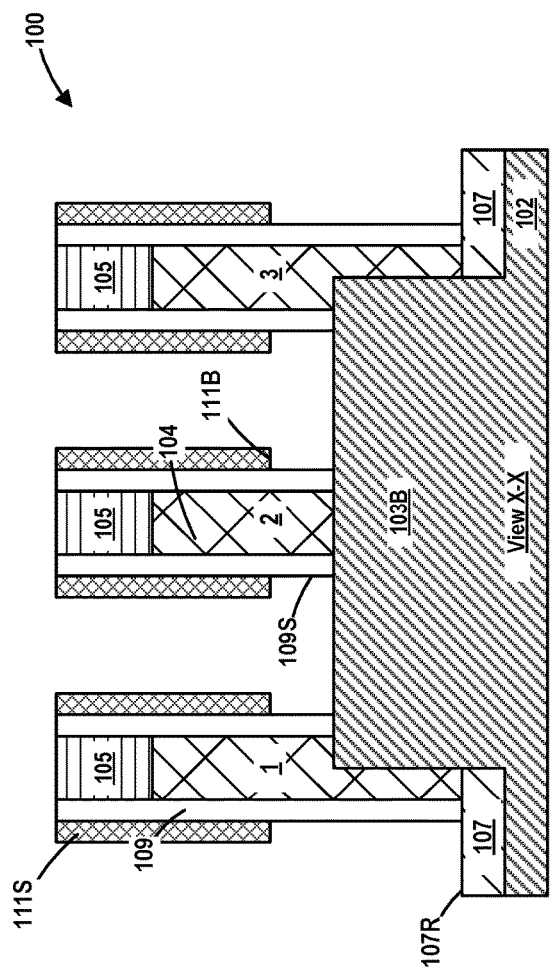
Figure 13:
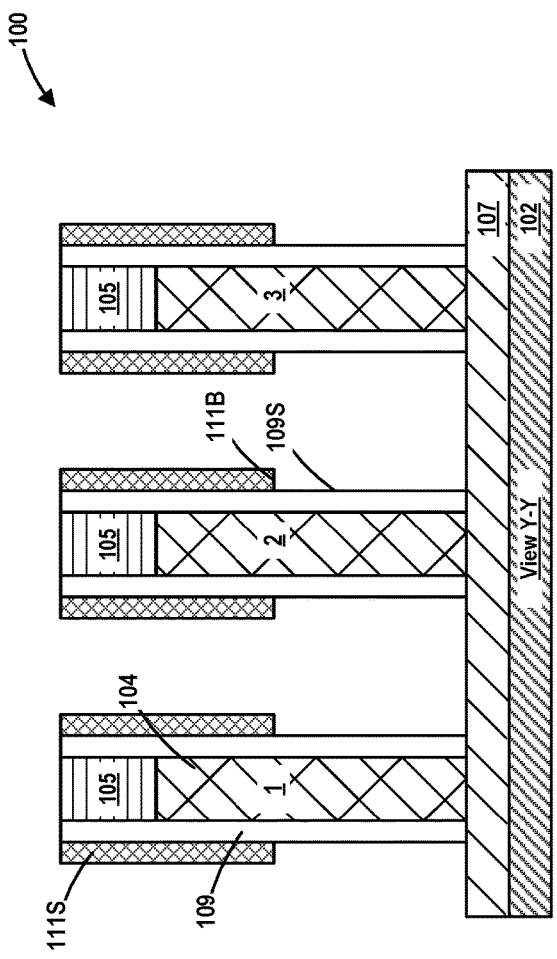

FIGS. 12 and 13 depict the IC product 100 after the recessed sacrificial layer of material 115A was removed selectively relative to the surrounding materials. Note that this process operation exposes a bottom surface 111B of the sacrificial sidewall spacer 111S and at least a portion of the substantially vertically oriented outer surface 109S of the sidewall spacer 109.

Figure 14:
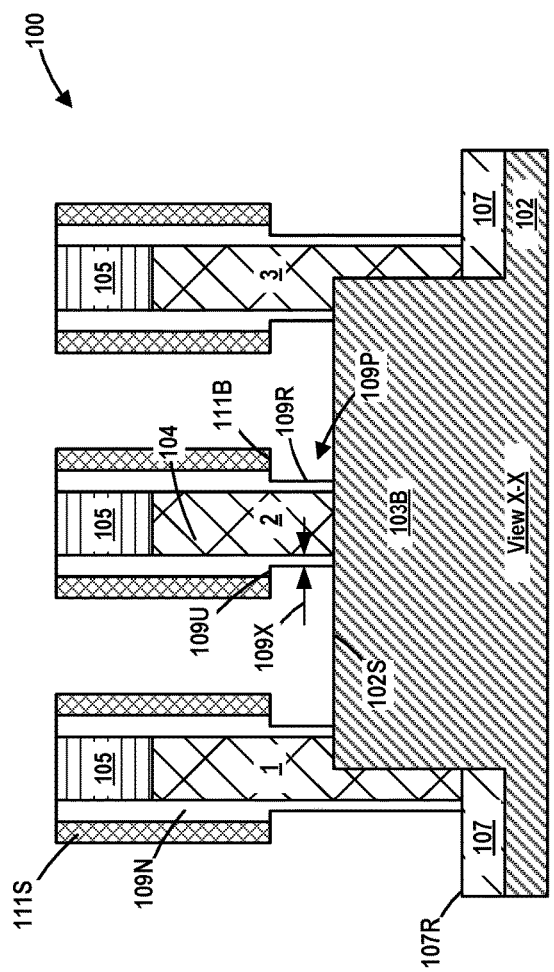
Figure 15:
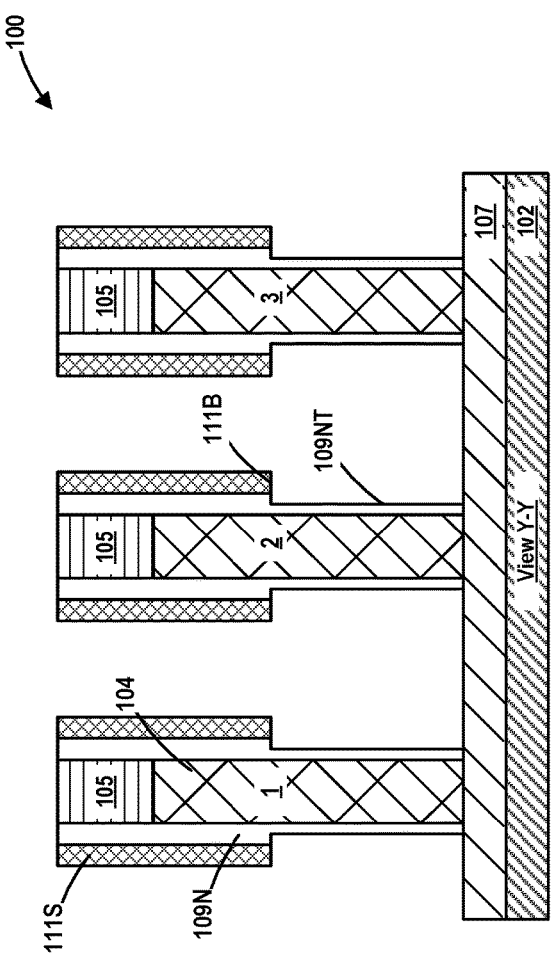

FIGS. 14 and 15 depict the IC product 100 after a spacer trimming etching process was performed to reduce the lateral thickness of the exposed portion of the sidewall spacer 109. In one illustrative embodiment, the spacer trimming etching process may be substantially isotropic in nature. This process operation results in the formation of a notched sidewall spacer 109N with a notch 109P formed therein. In one illustrative embodiment, the notch 109P of the notched sidewall spacer 109N is partially defined by a substantially vertically oriented trimmed outer surface 109R. The lateral thickness 109X of the notched sidewall spacer 109N at the notch 109P may vary depending upon the particular application, e.g., 10-30 nm. In terms of percentages, in some applications, the thickness 109X of the notched sidewall spacer 109N at the notch 109P may be about 30-70% of the initial thickness 109T of the sidewall spacer 109 at a location immediately above the notch 109P. The notch 109P is also partially defined by a substantially horizontally oriented upper surface 109U. The vertical height of the notch 109P at a location above the fin 103 (or substrate in the case of a planar device) will correspond approximately to the distance between the upper surface 102S and the bottom surface 111B of the sacrificial spacer 111S. Of course, since the transistor device 101 is a FinFET device in this illustrative example, the vertical height of the notch 109P will be greater at locations where the notched sidewall spacer 109N is positioned above the recessed isolation material 107 (see FIG. 14).

Figure 16:
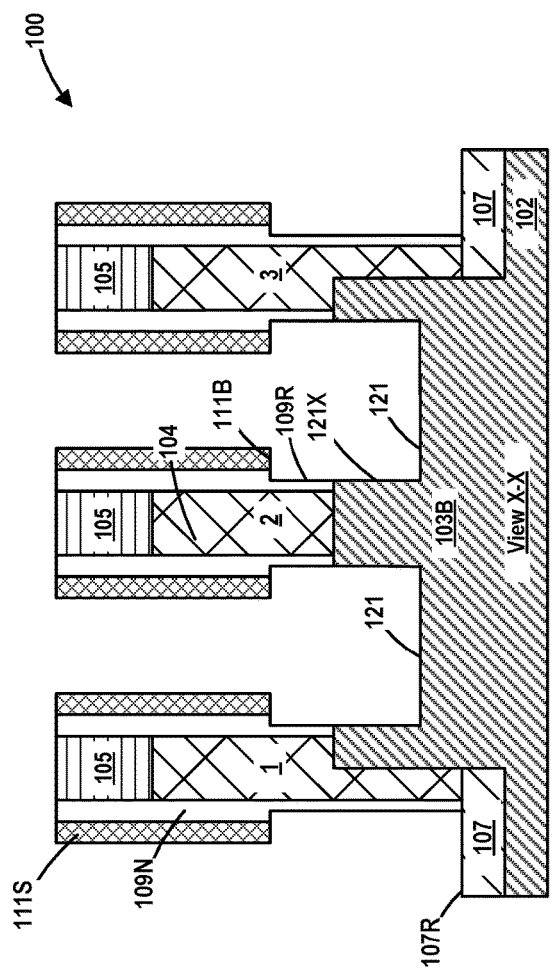
Figure 17:
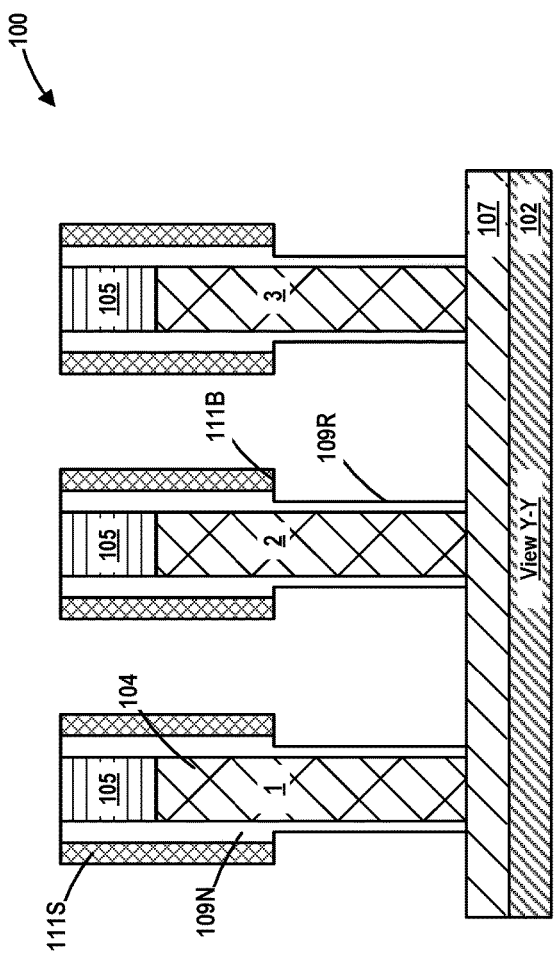

FIGS. 16 and 17 depict the product 100 after a substantially anisotropic cavity etching process (e.g., an RIE process) was performed to form a plurality of epi cavities 121 in the fins 103. Note that in the depicted process flow, the cavity etching process was performed with the sacrificial sidewall spacers 111S in position adjacent the notched sidewall spacers 109N. However, in other applications, depending upon the material used for the sidewall spacer 109, the sacrificial sidewall spacer 111S may be omitted prior to performing the cavity etching process. The depth of the epi cavities 121 may vary depending upon the particular application. Note that, in one illustrative example, the cavity sidewall 121X of each of the epi cavities 121 are substantially vertically aligned with the trimmed outer surface 109R of the notch 109P of the notched sidewall spacer 109N.

Figure 18:
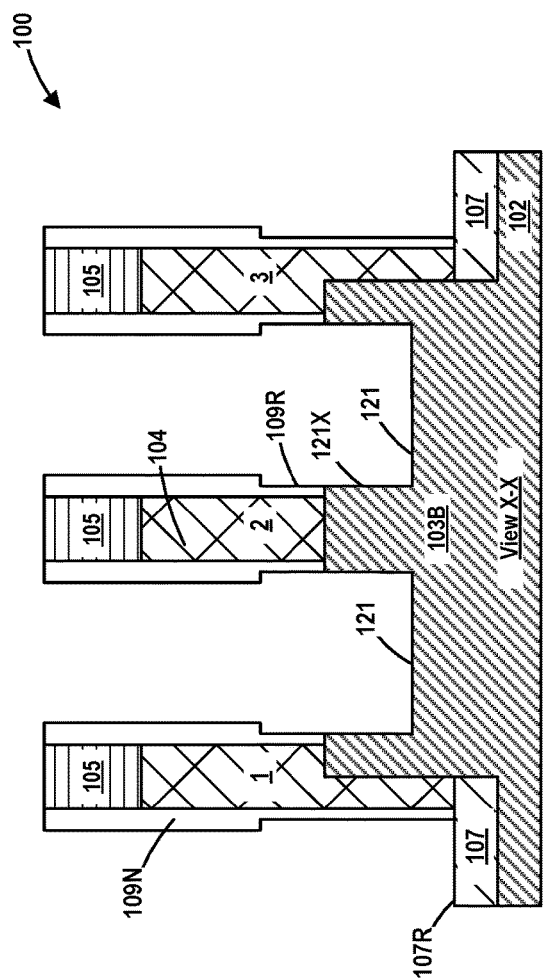
Figure 19:
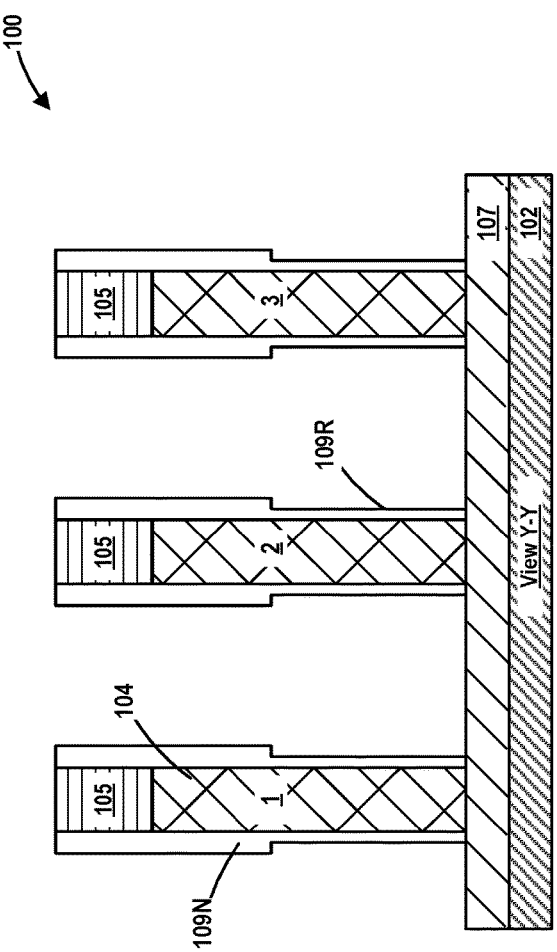

FIGS. 18 and 19 depict the product 100 after an etching process was performed to remove the sacrificial spacers 111S relative to the surrounding materials.

Figure 20:
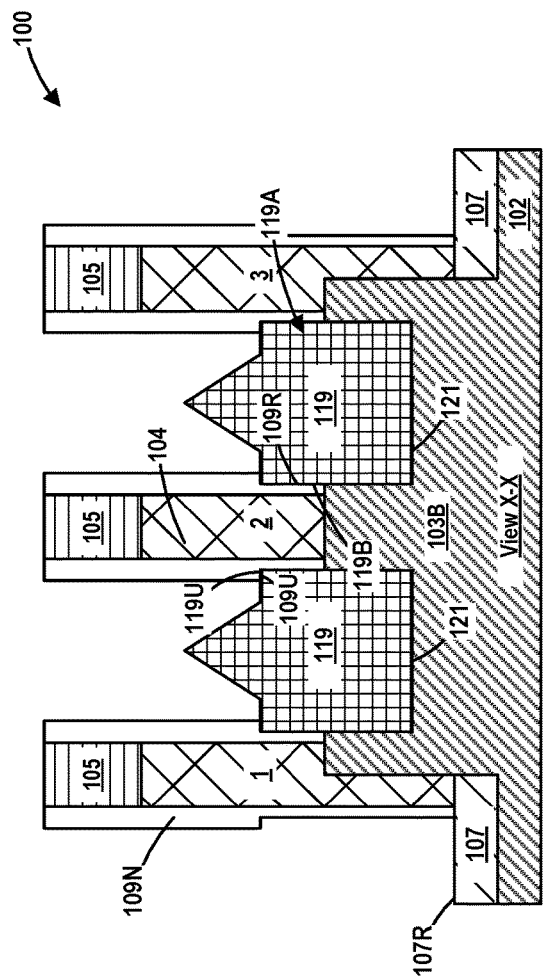
Figure 21:
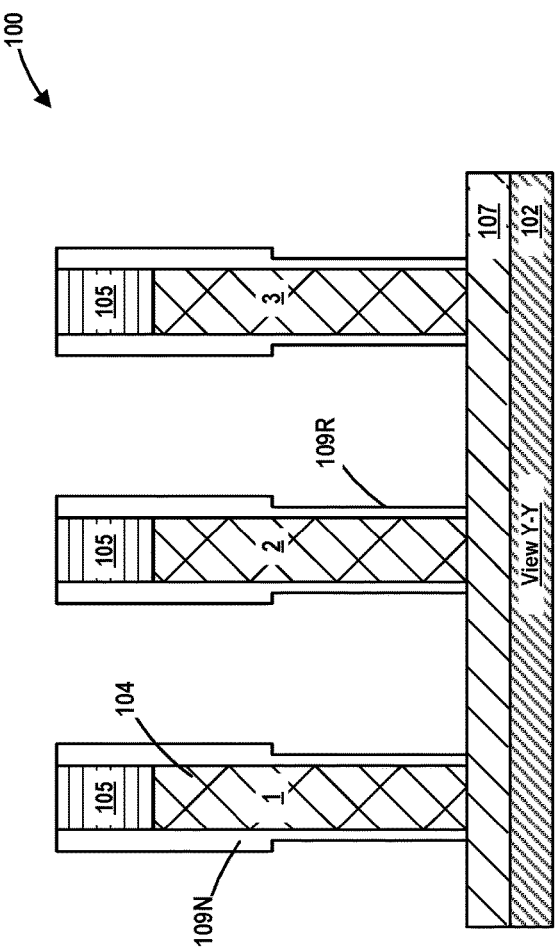

FIGS. 20 and 21 depict the product 100 after an epitaxial growth process was performed to form epi semiconductor material 119 in the epi cavities 121 formed in the source/drain regions of the transistors 101. In this particular example, the epi semiconductor material is depicted as being a faceted epi semiconductor material. The epi semiconductor material 119 may be any of a variety of different semiconductor materials, e.g., silicon-germanium, silicon, etc., for PFET transistor devices 101, or silicon-carbon, silicon, etc., for NFET transistor devices 101. Note that a portion 119A of the epi material 119 is positioned within the notch 109P in the notched sidewall spacer 109N. More specifically, a substantially vertically oriented surface 119A of the epi semiconductor material 119 abuts and engages the trimmed outer surface 109R of the notched sidewall spacer 109N, and a substantially horizontally oriented surface 119B of the epi semiconductor material 119 abuts and engages the substantially horizontally oriented upper surface 119U of the notched sidewall spacer 109N. After the formation of the epi semiconductor material 119, in one illustrative process flow, traditional manufacturing techniques may performed to form a metal silicide material (not shown), e.g., cobalt-silicide, nickel-silicide, etc., on the exposed portions of the epi semiconductor material 119.

Figure 22:
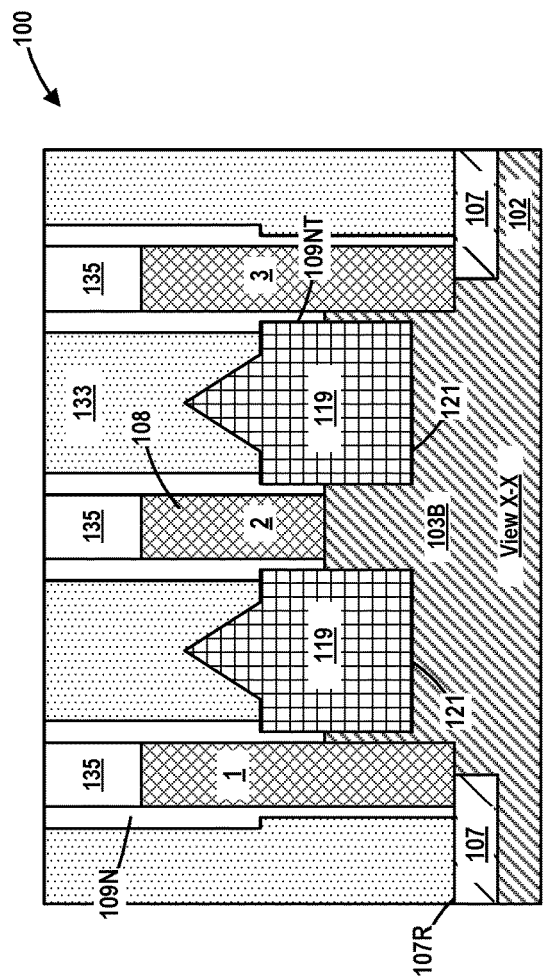
Figure 23:
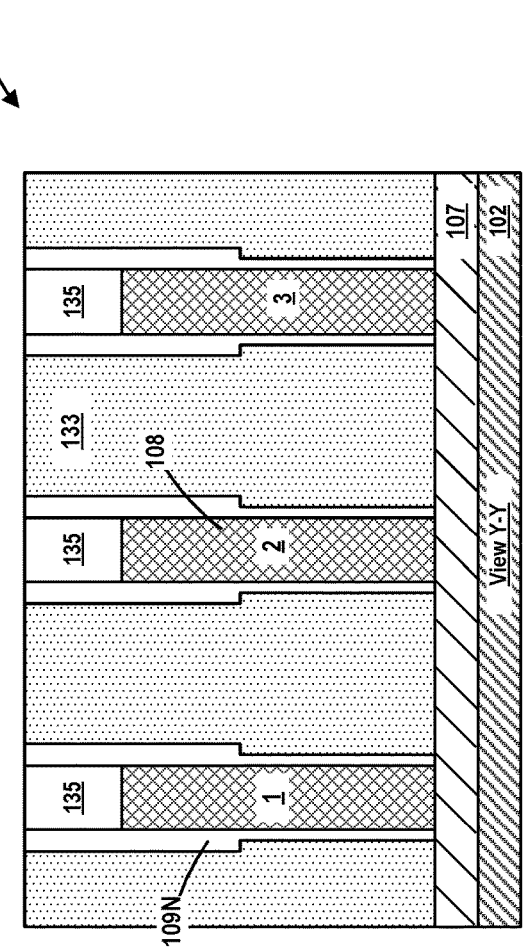

At the point of processing depicted in FIGS. 20-21, traditional manufacturing operations may be performed to complete the IC product 100. Accordingly, FIGS. 22-23 depict the IC product 100 after several processing operations were performed in accordance with one illustrative process flow. First, at least one layer of insulating material 133 was blanket-deposited across the product 100. Thereafter, at least one CMP process operation was performed to planarize the upper surface of the insulating material 133 and remove the gate caps 105 so as to expose the upper surface of the conductive gate electrode portion of the sacrificial gate structures 104.

At that point, traditional replacement gate manufacturing processes were performed to remove the sacrificial gate structures 104 so as to form replacement gate cavities between the spacers 109. The final gate structures 108 will ultimately be formed in the replacement gate cavities defined by removing the sacrificial gate structures 104. Typically, the materials for the final gate structures 108 are sequentially formed in replacement gate cavities. The final gate structures 108 typically comprise a high-k gate insulation layer (not separately shown), such as hafnium oxide, a material having a dielectric constant greater than 10, etc., and one or more conductive material layers that function as the gate electrode of the final gate structure 108. For example, one or more work-function adjusting metal layers and a bulk conductive material may be deposited in the replacement gate cavities to form the gate electrode structure. Thereafter, in this particular embodiment, the materials of the final gate structures 108 were recessed and the final gate caps 135 were formed on the product 100 by depositing gate cap material and performing a CMP process operation to planarize the upper surface of the gate caps 135 with the upper surface of the layer of insulating material 133.

Figure 24:
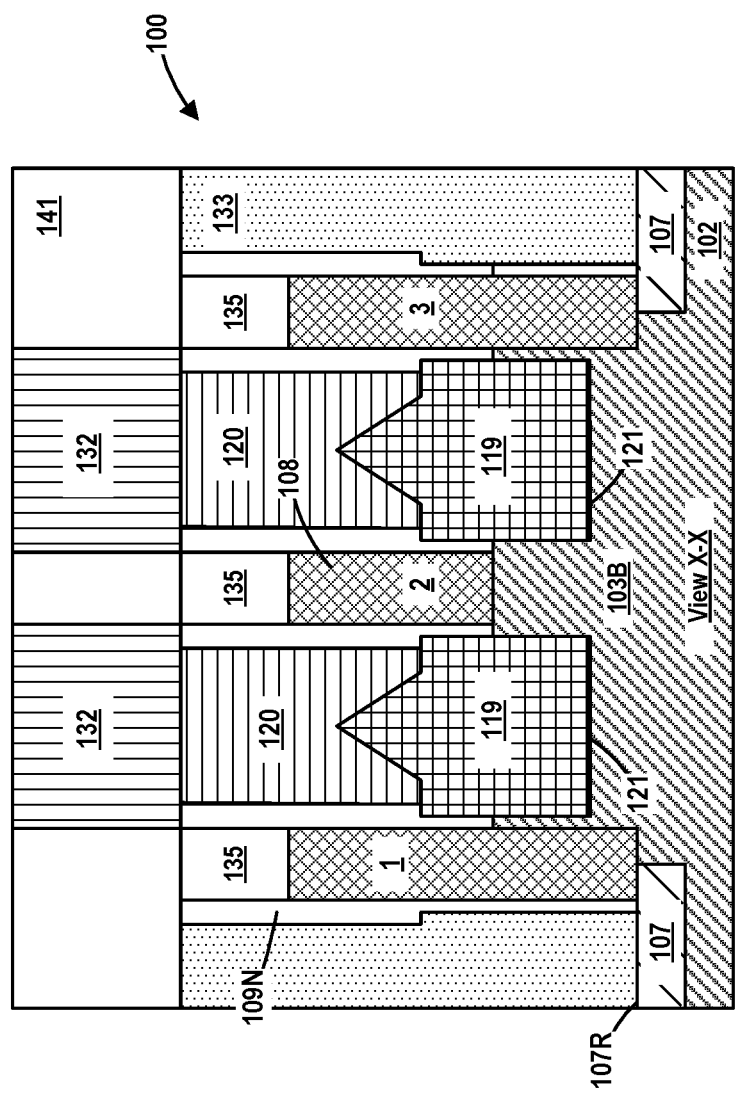
Figure 25:
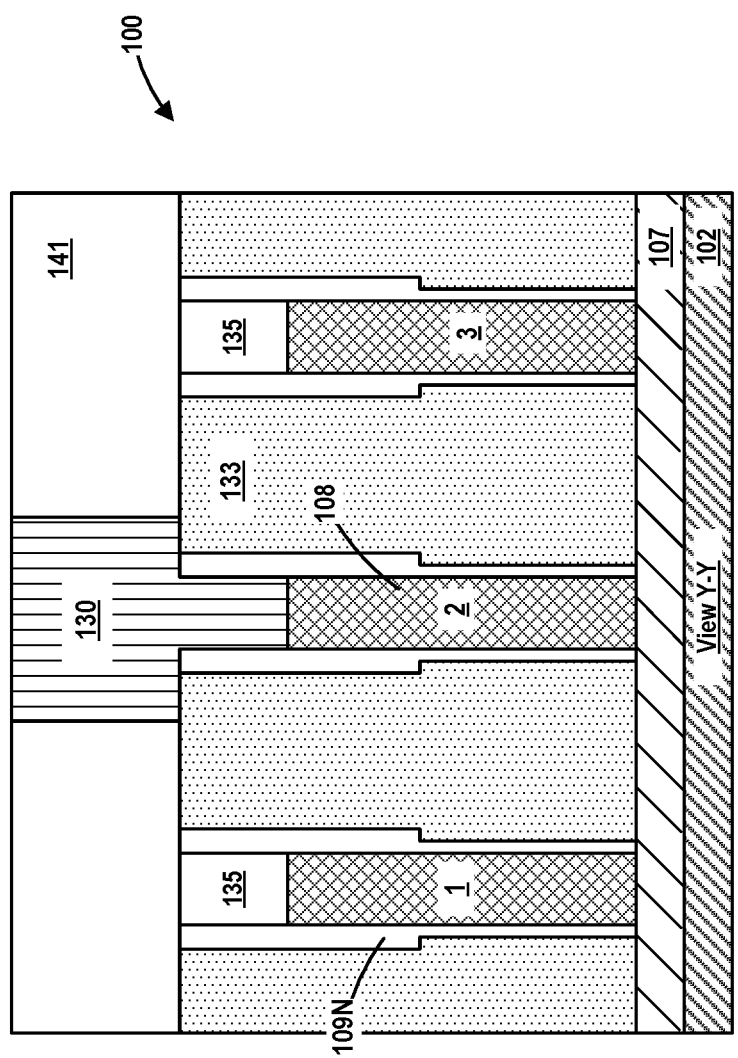

FIGS. 24-25 depict the product 100 after several process operations were performed in accordance with one illustrative process flow. First, one or more etching processes were performed through a patterned etch mask (not shown) to selectively remove the portions of the layer of insulating material 133 positioned above the epi material 119 formed in the active region 102X. The patterned etch mask was then removed. At that point, the conductive source/drain structures 120, e.g., trench silicide containing regions, were formed so as to contact the epi source/drain regions 119 (the source/drain regions). The conductive source/drain structures 120 constitute the conductive source/drain metallization structures that will eventually be conductively coupled to the conductive source/drain contact structures (CA) that are to be subsequently formed on the product 100. The configuration and structure of the conductive source/drain structures 120 may vary depending upon the particular application. In one example, the conductive source/drain structures 120 are line-type structures that extend into and out of the plane of the drawing page in FIG. 24 for a distance that corresponds to substantially the entire length of the active region (in the gate width direction of the device). In some cases, the conductive source/drain structures 120 comprise a trench metal silicide material (not separately shown) that is formed on and in contact with the epi material 119, and a metal material, such as tungsten (not separately shown), that is formed on and in contact with the trench metal silicide material. After the formation of the materials that make up the conductive source/drain structures 120, a chemical mechanical polishing (CMP) process was performed to remove excess materials located above the upper surface of the gate caps 135 of the final gate structures 108.

Thereafter, one or more layers of additional insulating material 141 were deposited on the product 100. At that point, several process operations were performed to form the CB gate contact structure 130 and the CA contact structure 132 for the transistor device 101. The contact structures 130 and 132 may be comprised of a variety of different materials and they may be formed by performing various manufacturing techniques. In one illustrative example, various contact openings were formed in the layer of insulating material for the contact structures 130 and 132. Thereafter, a portion of the gate cap 135 above the final gate structure 108 of gate 2 at a location above the recessed isolation material 107 was removed so as to thereby expose the final gate structure 108 of gate 2. At that point, one or more conductive materials (e.g., tungsten, copper, a metal-containing material, a metal compound, etc.) were then formed on the product 100 so as to overfill the contact openings in the insulating material 141/gate cap 135. At that point, a CMP process was performed to remove excess portions of the conductive materials from above the upper surface of the layer of insulating material 141. These process operations result in the formation of a CB gate contact structure 130, and the CA contact structures 132. In this embodiment, the CB gate contact structure 130 is positioned above the recessed isolation material 107 and it conductively contacts the final gate structure 108 of gate 2.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A transistor, comprising;
    a gate structure positioned above a semiconductor substrate;
    a sidewall spacer positioned adjacent a sidewall of the gate structure, the sidewall spacer comprising a first end and a second end, the first end being positioned adjacent the semiconductor substrate;
    a notch in the sidewall spacer proximate the first end, wherein the notch in the sidewall spacer is defined by a substantially vertically oriented side surface and a substantially horizontally oriented upper surface;
    an epi cavity in the semiconductor substrate, wherein the epi cavity comprises a substantially vertically oriented cavity sidewall that is substantially vertically aligned with the substantially vertically oriented side surface of the notch; and
    an epi semiconductor material positioned in the epi cavity and in the notch in the sidewall spacer, wherein the epi semiconductor material contacts and engages the substantially vertically oriented side surface of the notch and the substantially horizontally oriented upper surface of the notch.

2. The transistor of claim 1, wherein the sidewall spacer is positioned on and in contact with a sidewall of the gate structure and wherein a bottom surface of the sidewall spacer is positioned above an upper surface of the semiconductor substrate.

3. The transistor of claim 1, wherein a lateral thickness of the sidewall spacer at the notch is less than a lateral thickness of the sidewall spacer at a location immediately above the notch.

4. A transistor, comprising;
    a gate structure positioned above a semiconductor substrate;
    a sidewall spacer positioned adjacent a sidewall of the gate structure, the sidewall spacer comprising a first end and a second end, the first end being positioned above the semiconductor substrate, wherein a bottom surface of the sidewall spacer is positioned above an upper surface of the semiconductor substrate;
    a notch in the sidewall spacer proximate the first end, wherein the notch in the sidewall spacer is defined by a substantially vertically oriented side surface and a substantially horizontally oriented upper surface and wherein a lateral thickness of the sidewall spacer at the notch is less than a lateral thickness of the sidewall spacer at a location immediately above the notch;
    an epi cavity in the semiconductor substrate, wherein the epi cavity comprises a substantially vertically oriented cavity sidewall that is substantially vertically aligned with the substantially vertically oriented side surface of the notch; and
    an epi semiconductor material positioned in the epi cavity and in the notch in the sidewall spacer, wherein the epi semiconductor material contacts and engages the substantially vertically oriented side surface and the substantially horizontally oriented upper surface of the notch.

5. The transistor of claim 4, wherein the sidewall spacer is positioned on and in contact with a sidewall of the gate structure.

6. The transistor of claim 5, wherein the bottom surface of the sidewall spacer is positioned on and in contact with the upper surface of the semiconductor substrate.

7. A transistor, comprising;
    a gate structure positioned above a semiconductor substrate;
    a sidewall spacer positioned adjacent a sidewall of the gate structure, the sidewall spacer comprising a first end and a second end, the first end being positioned above the semiconductor substrate, wherein the sidewall spacer is positioned on and in contact with a sidewall of the gate structure and wherein a bottom surface of the sidewall spacer is positioned above an upper surface of the semiconductor substrate;
    a notch in the sidewall spacer proximate the first end, wherein a lateral thickness of the sidewall spacer at the notch is less than a lateral thickness of the sidewall spacer at a location immediately above the notch, wherein the notch in the sidewall spacer is defined by a substantially vertically oriented side surface and a substantially horizontally oriented upper surface;
    an epi cavity in the semiconductor substrate, wherein the epi cavity comprises a substantially vertically oriented cavity sidewall that is substantially vertically aligned with the substantially vertically oriented side surface of the notch; and
    an epi semiconductor material positioned in the epi cavity and in the notch in the sidewall spacer.

8. The transistor of claim 7, wherein the epi semiconductor material contacts and engages the substantially vertically oriented side surface and the substantially horizontally oriented upper surface of the notch.

* * * * *